(12) United States Patent
Li

(10) Patent No.: US 10,651,421 B2
(45) Date of Patent: May 12, 2020

(54) DISPLAY PANEL AND ENCAPSULATION COMPONENT

(71) Applicant: WUHAN CHINA STAR OPTOELECTRONICS SEMICONDUCTOR DISPLAY TECHNOLOGY CO., LTD., Wuhan, Hubei (CN)

(72) Inventor: Zhao Li, Hubei (CN)

(73) Assignee: WUHAN CHINA STAR OPTOELECTRONICS SEMICONDUCTOR DISPLAY TECHNOLOGY CO. LTD., Wuhan, Hubei (CN)

( * ) Notice: Subject to any disclaimer, the term of this patent is extended or adjusted under 35 U.S.C. 154(b) by 0 days.

(21) Appl. No.: 16/092,221

(22) PCT Filed: Sep. 5, 2018

(86) PCT No.: PCT/CN2018/104105
§ 371 (c)(1),
(2) Date: Oct. 9, 2018

(87) PCT Pub. No.: WO2020/024359
PCT Pub. Date: Feb. 6, 2020

(65) Prior Publication Data
US 2019/0372053 A1 Dec. 5, 2019

(30) Foreign Application Priority Data
Aug. 3, 2018 (CN) .......................... 2018 1 0876089

(51) Int. Cl.
*H01L 51/00* (2006.01)
*H01L 51/52* (2006.01)
(Continued)

(52) U.S. Cl.
CPC .......... *H01L 51/5256* (2013.01); *C08L 25/08* (2013.01); *C08L 33/12* (2013.01);
(Continued)

(58) Field of Classification Search
None
See application file for complete search history.

(56) References Cited

U.S. PATENT DOCUMENTS

2011/0140164 A1* 6/2011 Seo ..................... H01L 51/5256
257/100
2013/0265506 A1* 10/2013 Nishimura ........... G02B 5/0242
349/12
(Continued)

FOREIGN PATENT DOCUMENTS

CN 103050639 A 4/2013
CN 103975647 A 8/2014
(Continued)

*Primary Examiner* — Hung K Vu
(74) *Attorney, Agent, or Firm* — Mark M. Friedman

(57) ABSTRACT

The present disclosure provides a display panel and an encapsulation component. The display panel comprises a substrate component, a display assembly, and an encapsulation component. The encapsulation component comprises a first encapsulation layer, a second encapsulation layer, and a third encapsulation layer. The second encapsulation layer is sandwiched between the first encapsulation layer and the third encapsulation layer. The first encapsulation layer and the third encapsulation layer are made of an inorganic material. The second encapsulation layer is made of an organic material, and the second encapsulation layer comprises a plurality of organic nanoparticles in the second encapsulation layer. According to the present disclosure, water and oxygen outside of display panels are prevented from entering display panels.

18 Claims, 2 Drawing Sheets

(51) Int. Cl.
*C08L 33/12* (2006.01)
*C08L 25/08* (2006.01)
*C08L 33/26* (2006.01)

(52) U.S. Cl.
CPC ......... *C08L 33/26* (2013.01); *C08L 2203/206* (2013.01); *H01L 2251/301* (2013.01); *H01L 2251/5369* (2013.01)

(56) References Cited

U.S. PATENT DOCUMENTS

| | | |
|---|---|---|
| 2014/0138649 A1 | 5/2014 | Chen et al. |
| 2014/0320000 A1 | 10/2014 | Wakahara et al. |
| 2016/0380233 A1 | 12/2016 | Motomura |
| 2017/0309867 A1 | 10/2017 | Mun et al. |
| 2019/0051862 A1 | 2/2019 | Peng et al. |

FOREIGN PATENT DOCUMENTS

| | | | |
|---|---|---|---|
| CN | 106105390 A | | 11/2016 |
| CN | 106229420 A | | 12/2016 |
| CN | 107104199 A | | 8/2017 |
| CN | 107305756 A | | 10/2017 |

\* cited by examiner

DISPLAY PANEL AND ENCAPSULATION COMPONENT

FIELD OF INVENTION

The present disclosure relates to the field of display technology, and more particularly to a display panel and an encapsulation component.

BACKGROUND

Conventional organic light emitting diode (OLED) display panels include organic light-emitting materials therein, where organic light-emitting materials have to be isolated from water and oxygen.

To isolate organic light-emitting materials from water and oxygen, conventional OLED display panels are generally provided with an encapsulation component. The encapsulation component covers display assemblies of OLED display panels, and thus prevents water and oxygen outside of OLED display panels from permeating into OLED display panels and contacting organic light-emitting materials of display assemblies.

However, inventors of present patent application find that there are still some problems existing in the prior art, as described below.

Encapsulation components of conventional OLED display panels cannot satisfactorily seal display assemblies. Therefore, water and oxygen outside of OLED display panels are prone to pass through encapsulation components and enter OLED display panel, and contact organic light-emitting materials of display assemblies. This reduces lifetime of OLED display panels.

Therefore, there is a need to provide a display panel and an encapsulation component to solve the above-said problems.

SUMMARY OF DISCLOSURE

The present disclosure provides a display panel and an encapsulation component. According to the present disclosure, water and oxygen outside of display panels are prevented from entering display panels, increasing water and oxygen blocking ability of display panels.

To solve the above-said problems, the present disclosure provides the following technical schemes.

The present disclosure provides a display panel, comprising:

a substrate component;

a display assembly disposed on the substrate component; and an encapsulation component disposed on the display assembly, wherein the encapsulation component comprises a first encapsulation layer, a second encapsulation layer, and a third encapsulation layer, the second encapsulation layer is sandwiched between the first encapsulation layer and the third encapsulation layer, the first encapsulation layer and the third encapsulation layer are made of an inorganic material, the second encapsulation layer is made of an organic material, and the second encapsulation layer comprises a plurality of organic nanoparticles;

wherein the organic material comprises poly(methyl methacrylate), methyl methacrylate, or a combination thereof;

wherein the organic nanoparticles comprise polystyrene-poly(N-isopropylacrylamide) nanoparticles, poly(methyl methacrylate) nanoparticles, or a combination thereof;

wherein the organic nanoparticles have a diameter of 40-400 nanometers;

wherein a first ratio of a thickness of the first encapsulation layer to a thickness of the second encapsulation layer ranges from 1/20 to 1/5, and a second ratio of the thickness of the first encapsulation layer to a thickness of the third encapsulation layer ranges from 1/2 to 2/1; and wherein the inorganic material comprises silicon nitride or silicon oxynitride.

In the display panel of the present disclosure, the organic material comprises poly(methyl methacrylate), and the organic nanoparticles comprise polystyrene-poly(N-isopropylacrylamide) nanoparticles, poly(methyl methacrylate) nanoparticles, or a combination thereof; or the organic material comprises methyl methacrylate, and the organic nanoparticles comprise poly(methyl methacrylate) nanoparticles.

The present disclosure provides a display panel, comprising:

a substrate component;

a display assembly disposed on the substrate component; and an encapsulation component disposed on the display assembly, wherein the encapsulation component comprises a first encapsulation layer, a second encapsulation layer, and a third encapsulation layer, the second encapsulation layer is sandwiched between the first encapsulation layer and the third encapsulation layer, the first encapsulation layer and the third encapsulation layer are made of an inorganic material, the second encapsulation layer is made of an organic material, and the second encapsulation layer comprises a plurality of organic nanoparticles.

In the display panel of the present disclosure, the organic material comprises poly(methyl methacrylate), methyl methacrylate, or a combination thereof; and the organic nanoparticles comprise polystyrene-poly(N-isopropylacrylamide) nanoparticles, poly(methyl methacrylate) nanoparticles, or a combination thereof.

In the display panel of the present disclosure, the organic material comprises poly(methyl methacrylate), and the organic nanoparticles comprise polystyrene-poly(N-isopropylacrylamide) nanoparticles, poly(methyl methacrylate) nanoparticles, or a combination thereof; or the organic material comprises methyl methacrylate, and the organic nanoparticles comprise poly(methyl methacrylate) nanoparticles.

In the display panel of the present disclosure, the second encapsulation layer is formed by dispersing the polystyrene-poly(N-isopropylacrylamide) nanoparticles, the poly(methyl methacrylate) nanoparticles, or the combination thereof having a diameter of 40-400 nanometers and a mass concentration of 0.2-2% into a solution comprising an organic monomer and a polymerization initiator to produce a mixed solution, and spraying the mixed solution onto the first encapsulation layer.

In the display panel of the present disclosure, the second encapsulation layer further comprises at least one fibrous web disposed in the second encapsulation layer, and the fibrous web comprises at least two meshes having a diameter smaller than a diameter of the polystyrene-poly(N-isopropylacrylamide) nanoparticles, the poly(methyl methacrylate) nanoparticles, or the combination thereof.

In the display panel of the present disclosure, the polystyrene-poly(N-isopropylacrylamide) nanoparticles, the poly(methyl methacrylate) nanoparticles, or the combination thereof disposed in the second encapsulation layer having the fibrous web are arranged to have a layered structure.

In the display panel of the present disclosure, the organic nanoparticles have a diameter of 40-400 nanometers.

In the display panel of the present disclosure, a first ratio of a thickness of the first encapsulation layer to a thickness of the second encapsulation layer ranges from 1/20 to 1/5, and a second ratio of the thickness of the first encapsulation layer to a thickness of the third encapsulation layer ranges from 1/2 to 2/1.

In the display panel of the present disclosure, the inorganic material comprises silicon nitride or silicon oxynitride.

The present disclosure provides an encapsulation component, wherein the encapsulation component comprises a first encapsulation layer, a second encapsulation layer, and a third encapsulation layer, the second encapsulation layer is sandwiched between the first encapsulation layer and the third encapsulation layer, the first encapsulation layer and the third encapsulation layer are made of an inorganic material, the second encapsulation layer is made of an organic material, and the second encapsulation layer comprises a plurality of organic nanoparticles.

In the encapsulation component of the present disclosure, the organic material comprises poly(methyl methacrylate), methyl methacrylate, or a combination thereof; and the organic nanoparticles comprise polystyrene-poly(N-isopropylacrylamide) nanoparticles, poly(methyl methacrylate) nanoparticles, or a combination thereof.

In the encapsulation component of the present disclosure, the organic material comprises poly(methyl methacrylate), and the organic nanoparticles comprise polystyrene-poly(N-isopropylacrylamide) nanoparticles, poly(methyl methacrylate) nanoparticles, or a combination thereof; or the organic material comprises methyl methacrylate, and the organic nanoparticles comprise poly(methyl methacrylate) nanoparticles.

In the encapsulation component of the present disclosure, the second encapsulation layer is formed by dispersing the polystyrene-poly(N-isopropylacrylamide) nanoparticles, the poly(methyl methacrylate) nanoparticles, or the combination thereof having a diameter of 40-400 nanometers and a mass concentration of 0.2-2% into a solution comprising an organic monomer and a polymerization initiator to produce a mixed solution, and spraying the mixed solution onto the first encapsulation layer.

In the encapsulation component of the present disclosure, the second encapsulation layer further comprises at least one fibrous web disposed in the second encapsulation layer, and the fibrous web comprises at least two meshes having a diameter smaller than a diameter of the polystyrene-poly(N-isopropylacrylamide) nanoparticles, the poly(methyl methacrylate) nanoparticles, or the combination thereof.

In the encapsulation component of the present disclosure, the polystyrene-poly(N-isopropylacrylamide) nanoparticles, the poly(methyl methacrylate) nanoparticles, or the combination thereof disposed in the second encapsulation layer having the fibrous web are arranged to have a layered structure.

In the encapsulation component of the present disclosure, the organic nanoparticles have a diameter of 40-400 nanometers.

In the encapsulation component of the present disclosure, a first ratio of a thickness of the first encapsulation layer to a thickness of the second encapsulation layer ranges from 1/20 to 1/5, and a second ratio of the thickness of the first encapsulation layer to a thickness of the third encapsulation layer ranges from 1/2 to 2/1.

In the encapsulation component of the present disclosure, the inorganic material comprises silicon nitride or silicon oxynitride.

According to the present disclosure, both the first encapsulation layer and the third encapsulation layer of the encapsulation component are made of an inorganic material, and the second encapsulation layer sandwiched between the first encapsulation layer and the third encapsulation layer is made of an organic material, and the second encapsulation layer comprises a plurality of organic nanoparticles therein. Therefore, according to the present disclosure, water and oxygen outside of display panels are prevented from entering display panels, increasing water and oxygen blocking ability of display panels.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
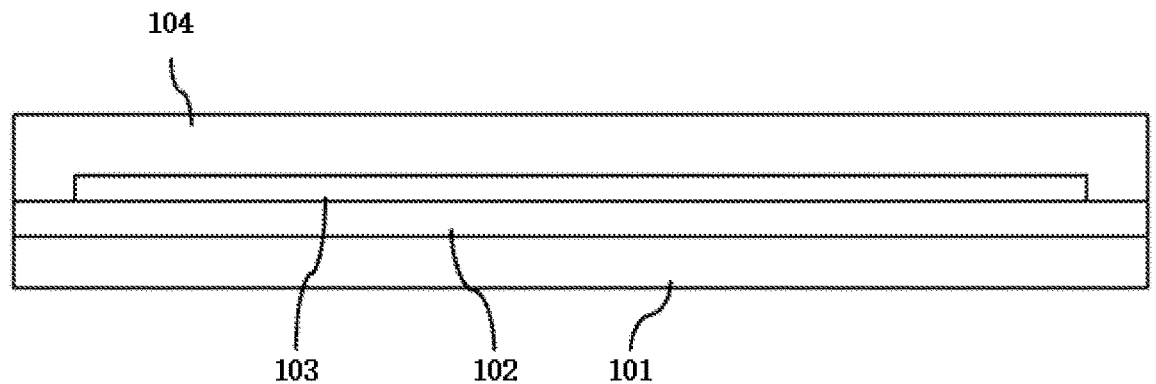
FIG. 1 shows a cross-sectional view of a display panel of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Figure 2:
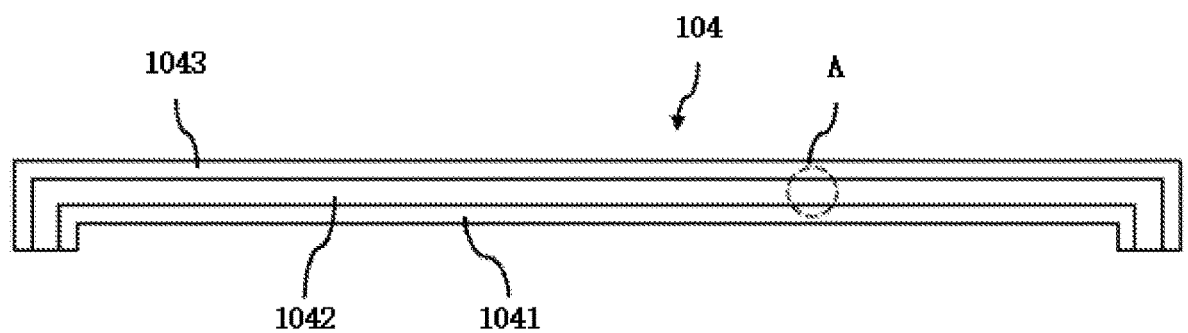
FIG. 2 shows a cross-sectional view of an encapsulation component in a display panel of the present disclosure.
Figure 3:
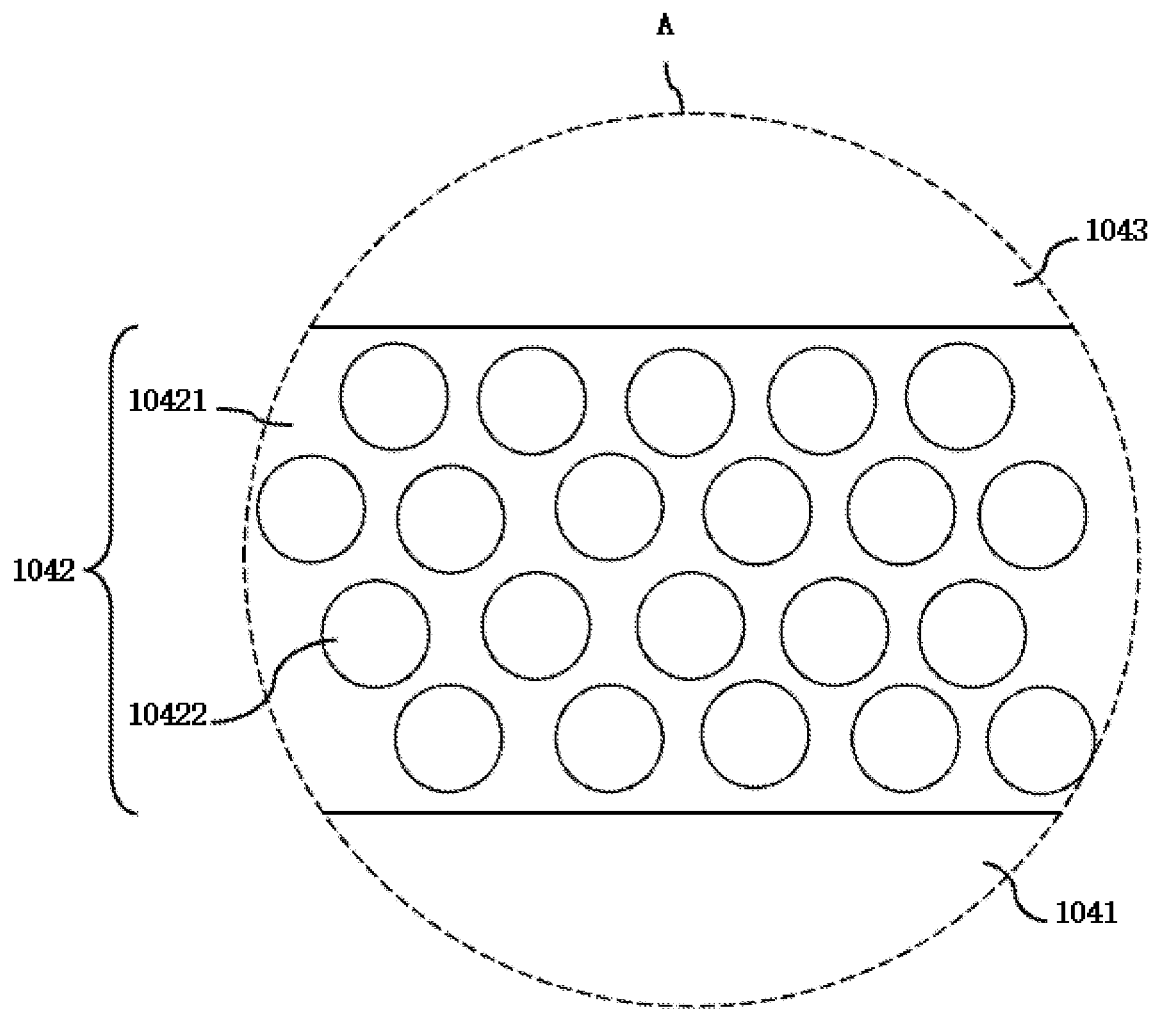
FIG. 3 shows an enlarged view of the area A shown in FIG. 2.

Please refer to FIGS. 1, 2, and 3. FIG. 1 shows a cross-sectional view of a display panel of the present disclosure. FIG. 2 shows a cross-sectional view of an encapsulation component 104 in a display panel of the present disclosure. FIG. 3 shows an enlarged view of the area A shown in FIG. 2.

The display panel of the present disclosure includes a substrate component, a display assembly 103, and an encapsulation component 104.

The substrate component includes a base plate 101, or the substrate component includes a base plate 101 and a flexible film layer 102 disposed on the base plate 101. The display assembly 103 is disposed on the substrate component. The display assembly 103 could be an organic light emitting diode (OLED) display assembly.

The encapsulation component 104 is disposed on the display assembly 103. The encapsulation component 104, together with the substrate component, constitutes a sealed chamber. The display assembly 103 is disposed within the sealed chamber. The encapsulation component 104 includes a first encapsulation layer 1041, a second encapsulation layer 1042, and a third encapsulation layer 1043. The second encapsulation layer 1042 is sandwiched between the first encapsulation layer 1041 and the third encapsulation layer

1043. The first encapsulation layer 1041 and the third encapsulation layer 1043 are made of an inorganic material. The second encapsulation layer 1042 is made of an organic material 10421, and the second encapsulation layer 1042 includes a plurality of organic nanoparticles 10422 therein.

The organic material 10421 includes poly(methyl methacrylate) (PMMA), methyl methacrylate (MMA), or a combination thereof.

The organic nanoparticles 10422 includes polystyrene-poly(N-isopropylacrylamide) nanoparticles (PS—PNIPAm NPs), poly(methyl methacrylate) nanoparticles (PMMA NPs), or a combination thereof. For example, if the organic material 10421 includes poly(methyl methacrylate), the organic nanoparticles 10422 includes polystyrene-poly(N-isopropylacrylamide) nanoparticles, poly(methyl methacrylate) nanoparticles, or a combination thereof. And, if the organic material 10421 includes methyl methacrylate, the organic nanoparticles 10422 includes poly(methyl methacrylate) nanoparticles.

The polystyrene-poly(N-isopropylacrylamide) nanoparticles are of a core-shell structure. The polystyrene-poly(N-isopropylacrylamide) nanoparticles have both a hydrophilic property and a lipophilic property. Polystyrene (PS) is lipophilic, and can be well dissolved with poly(methyl methacrylate) (PMMA).

Poly(N-isopropylacrylamide) nanoparticles (PNIPAm) is hydrophilic, and can bind with water. Since nanoparticles (NPs) have high specific surface area, nanoparticles is helpful for organic layer to absorb water and oxygen entering from outside. Poly(N-isopropylacrylamide) is a hydrogel that has a strong water absorbing ability. By adjusting ratio of polystyrene to poly(N-isopropylacrylamide), water absorption property of polystyrene-poly(N-isopropylacrylamide) nanoparticles could be controlled. That is, the ratio of polystyrene to poly(N-isopropylacrylamide) is predetermined, and the polystyrene-poly(N-isopropylacrylamide) nanoparticles are used to increase water and oxygen blocking ability of the second encapsulation layer 1042.

The organic nanoparticles 10422 have a diameter of 40-400 nanometers. For example, the diameter of the organic nanoparticles is 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, 370 nm, 380 nm, 380 nm, or 400 nm.

A first ratio of a thickness of the first encapsulation layer 1041 to a thickness of the second encapsulation layer 1042 ranges from 1/20 to 1/5. For example, the first ratio is 1/20, 1/19, 1/18, 1/17, 1/16, 1/15, 1/14, 1/13, 1/12, 1/11, 1/10, 1/9, 1/8, 1/7, 1/6, or 1/5. Preferably, the first ratio is 1/12.

And, a second ratio of the thickness of the first encapsulation layer 1041 to a thickness of the third encapsulation layer 1043 ranges from 1/2 to 2/1. For example, the second ratio is 1/2, 1.3/2, 1.5/2, 1.8/2, 1/1, 2.3/2, 2.5/2, 2.8/2, 3/2, 3.3/2, 3.5/2, 3.8/2, or 2/1. Preferably, the second ratio is 1/1.

The inorganic material includes silicon nitride or silicon oxynitride. For example, both the first encapsulation layer 1041 and the third encapsulation layer 1043 are made of silicon nitride or silicon oxynitride. Alternatively, the first encapsulation layer 1041 is made of one of silicon nitride and silicon oxynitride, and the third encapsulation layer 1043 is made of the other of silicon nitride and silicon oxynitride.

The second encapsulation layer 1042 is formed by dispersing the polystyrene-poly(N-isopropylacrylamide) nanoparticles, the poly(methyl methacrylate) nanoparticles, or a combination thereof having a diameter of 40-400 nanometers and a mass concentration of 0.2-2% into a solution including an organic monomer (MMA) and a polymerization initiator (used to initiate polymerization of organic monomer) to produce a mixed solution (i.e., a mixed solution that includes the polystyrene-poly(N-isopropylacrylamide) nanoparticles and/or the poly(methyl methacrylate) nanoparticles, and poly(methyl methacrylate) and/or methyl methacrylate), and spraying the mixed solution onto the first encapsulation layer 1041.

The second encapsulation layer 1042 further includes at least one fibrous web disposed in the second encapsulation layer 1042, and the fibrous web includes at least two meshes having a diameter smaller than a diameter of the polystyrene-poly(N-isopropylacrylamide) nanoparticles, the poly(methyl methacrylate) nanoparticles, or the combination thereof. The fibrous web functions to have the polystyrene-poly(N-isopropylacrylamide) nanoparticles and/or the poly(methyl methacrylate) nanoparticles arrange in order, so as to increase distribution uniformity of the polystyrene-poly(N-isopropylacrylamide) nanoparticles and/or the poly(methyl methacrylate) nanoparticles in the second encapsulation layer 1042. Additionally, the fibrous web functions to have the polystyrene-poly(N-isopropylacrylamide) nanoparticles and/or the poly(methyl methacrylate) nanoparticles arrange to have a layered structure, where such a layered structure increases water and oxygen blocking ability of the second encapsulation layer 1042.

The plane where the fibrous web is disposed is parallel to or is generally parallel to the plane where the second encapsulation layer 1042 is disposed (or the plane where the first encapsulation layer 1041 is disposed).

The fibrous web includes an extension portion. The extension portion extends from body of the fibrous web towards outside. A predetermined angle is produced between the extension portion and the plane where body of the fibrous web is disposed. The predetermined angle ranges from 30 degrees to 90 degrees. For example, the predetermined angle is 30 degree, 35 degree, 40 degree, 45 degree, 50 degree, 55 degree, 60 degree, 65 degree, 70 degree, 75 degree, 80 degree, 85 degree, or 90 degree. The extension portion is used to support body of the fibrous web, such that body of the fibrous web is parallel to or is generally parallel to the plane where the second encapsulation layer 1042 is disposed (or the plane where the first encapsulation layer 1041 is disposed).

The meshes are formed in body of the fibrous web.

According to the present disclosure, both the first encapsulation layer 1041 and the third encapsulation layer 1043 of the encapsulation component 104 are made of an inorganic material, and the second encapsulation layer 1042 sandwiched between the first encapsulation layer 1041 and the third encapsulation layer 1043 is made of an organic material 10421, and the second encapsulation layer 1042 comprises a plurality of organic nanoparticles 10422 therein. Therefore, according to the present disclosure, water and oxygen outside of display panels are prevented from entering display panels, increasing water and oxygen blocking ability of display panels.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, comprising:
   a substrate component;
   a display assembly disposed on the substrate component; and
   an encapsulation component disposed on the display assembly, wherein the encapsulation component comprises a first encapsulation layer, a second encapsulation layer, and a third encapsulation layer, the second encapsulation layer is sandwiched between the first encapsulation layer and the third encapsulation layer, the first encapsulation layer and the third encapsulation layer are made of an inorganic material, the second encapsulation layer is made of an organic material, and the second encapsulation layer comprises a plurality of organic nanoparticles in the second encapsulation layer;
   wherein the organic material comprises poly(methyl methacrylate), methyl methacrylate, or a combination thereof;
   wherein the organic nanoparticles comprise polystyrene-poly(N-isopropylacrylamide) nanoparticles, poly(methyl methacrylate) nanoparticles, or a combination thereof;
   wherein the organic nanoparticles have a diameter of 40-400 nanometers;
   wherein a first ratio of a thickness of the first encapsulation layer to a thickness of the second encapsulation layer ranges from 1/20 to 1/5, and a second ratio of the thickness of the first encapsulation layer to a thickness of the third encapsulation layer ranges from 1/2 to 2/1; and
   wherein the inorganic material comprises silicon nitride or silicon oxynitride.

2. The display panel according to claim 1, wherein the organic material comprises poly(methyl methacrylate), and the organic nanoparticles comprises polystyrene-poly(N-isopropylacrylamide) nanoparticles, poly(methyl methacrylate) nanoparticles, or a combination thereof; or
   the organic material comprises methyl methacrylate, and the organic nanoparticles comprise poly (methyl methacrylate) nanoparticles.

3. A display panel, comprising:
   a substrate component;
   a display assembly disposed on the substrate component; and
   an encapsulation component disposed on the display assembly, wherein the encapsulation component comprises a first encapsulation layer, a second encapsulation layer, and a third encapsulation layer, the second encapsulation layer is sandwiched between the first encapsulation layer and the third encapsulation layer, the first encapsulation layer and the third encapsulation layer are made of an inorganic material, the second encapsulation layer is made of an organic material, and the second encapsulation layer comprises a plurality of organic nanoparticles in the second encapsulation layer,
   wherein the organic material comprises poly(methyl methacrylate), methyl methacrylate, or a combination thereof; and
   the organic nanoparticles comprises polystyrene-poly(N-isopropylacrylamide) nanoparticles, poly(methyl methacrylate) nanoparticles, or a combination thereof.

4. The display panel according to claim 3, wherein the organic material comprises poly(methyl methacrylate), and the organic nanoparticles comprises polystyrene-poly(N-isopropylacrylamide) nanoparticles, poly(methyl methacrylate) nanoparticles, or a combination thereof; or
   the organic material comprises methyl methacrylate, and the organic nanoparticles comprise poly(methyl methacrylate) nanoparticles.

5. The display panel according to claim 3, wherein the second encapsulation layer is formed by dispersing the polystyrene-poly(N-isopropylacrylamide) nanoparticles, the poly(methyl methacrylate) nanoparticles, or the combination thereof having a diameter of 40-400 nanometers and a mass concentration of 0.2-2% into a solution comprising an organic monomer and a polymerization initiator to produce a mixed solution, and spraying the mixed solution onto the first encapsulation layer.

6. The display panel according to claim 3, wherein the second encapsulation layer further comprises at least one fibrous web disposed in the second encapsulation layer, and the fibrous web comprises at least two meshes having a diameter smaller than a diameter of the polystyrene-poly(N-isopropylacrylamide) nanoparticles, the poly(methyl methacrylate) nanoparticles, or the combination thereof.

7. The display panel according to claim 6, wherein the polystyrene-poly(N-isopropylacrylamide) nanoparticles, the poly(methyl methacrylate) nanoparticles, or the combination thereof disposed in the second encapsulation layer having the fibrous web are arranged to have a layered structure.

8. The display panel according to claim 3, wherein the organic nanoparticles have a diameter of 40-400 nanometers.

9. The display panel according to claim 3, wherein a first ratio of a thickness of the first encapsulation layer to a thickness of the second encapsulation layer ranges from 1/20 to 1/5, and a second ratio of the thickness of the first encapsulation layer to a thickness of the third encapsulation layer ranges from 1/2 to 2/1.

10. The display panel according to claim 3, wherein the inorganic material comprises silicon nitride or silicon oxynitride.

11. An encapsulation component, wherein the encapsulation component comprises a first encapsulation layer, a second encapsulation layer, and a third encapsulation layer, the second encapsulation layer is sandwiched between the first encapsulation layer and the third encapsulation layer, the first encapsulation layer and the third encapsulation layer are made of an inorganic material, the second encapsulation layer is made of an organic material, and the second encapsulation layer comprises a plurality of organic nanoparticles in the second encapsulation layer,
    wherein the organic material comprises poly(methyl methacrylate), methyl methacrylate, or a combination thereof; and
    the organic nanoparticles comprise polystyrene-poly(N-isopropylacrylamide) nanoparticles, poly(methyl methacrylate) nanoparticles, or a combination thereof.

12. The encapsulation component according to claim 11, wherein the organic material comprises poly(methyl methacrylate), and the organic nanoparticles comprise polystyrene-poly(N-isopropylacrylamide) nanoparticles, poly(methyl methacrylate) nanoparticles, or a combination thereof; or
    the organic material comprises methyl methacrylate, and the organic nanoparticles comprise poly(methyl methacrylate) nanoparticles.

13. The encapsulation component according to claim 11, wherein the second encapsulation layer is formed by dispersing the polystyrene-poly(N-isopropylacrylamide) nanoparticles, the poly(methyl methacrylate) nanoparticles, or the combination thereof having a diameter of 40-400 nanometers and a mass concentration of 0.2-2% into a solution comprising an organic monomer and a polymerization initiator to produce a mixed solution, and spraying the mixed solution onto the first encapsulation layer.

14. The encapsulation component according to claim 11, wherein the second encapsulation layer further comprises at least one fibrous web disposed in the second encapsulation layer, and the fibrous web comprises at least two meshes having a diameter smaller than a diameter of the polystyrene-poly(N-isopropylacrylamide) nanoparticles, the poly(methyl methacrylate) nanoparticles, or the combination thereof.

15. The encapsulation component according to claim 14, wherein the polystyrene-poly(N-isopropylacrylamide) nanoparticles, the poly(methyl methacrylate) nanoparticles, or the combination thereof disposed in the second encapsulation layer having the fibrous web are arranged to have a layered structure.

16. The encapsulation component according to claim 11, wherein the organic nanoparticles have a diameter of 40-400 nanometers.

17. The encapsulation component according to claim 11, wherein a first ratio of a thickness of the first encapsulation layer to a thickness of the second encapsulation layer ranges from 1/20 to 1/5, and a second ratio of the thickness of the first encapsulation layer to a thickness of the third encapsulation layer ranges from 1/2 to 2/1.

18. The encapsulation component according to claim 11, wherein the inorganic material comprises silicon nitride or silicon oxynitride.

* * * * *